(12) United States Patent
Chen et al.

(10) Patent No.: US 12,429,287 B2
(45) Date of Patent: Sep. 30, 2025

(54) HEAT EXCHANGING APPARATUS

(71) Applicant: TAIWAN MASK CORPORATION, Hsinchu County (TW)

(72) Inventors: Chih-Ming Chen, Hsinchu County (TW); Chih-Kang Toh, Hsinchu County (TW)

(73) Assignee: TAIWAN MASK CORPORATION, Hsinchu County (TW)

( * ) Notice: Subject to any disclaimer, the term of this patent is extended or adjusted under 35 U.S.C. 154(b) by 143 days.

(21) Appl. No.: 18/526,767

(22) Filed: Dec. 1, 2023

(65) Prior Publication Data
US 2024/0183620 A1 Jun. 6, 2024

Related U.S. Application Data

(60) Provisional application No. 63/429,295, filed on Dec. 1, 2022.

(30) Foreign Application Priority Data

Sep. 11, 2023 (TW) ................................ 112134541

(51) Int. Cl.
    *F28D 9/00*     (2006.01)
    *F28D 21/00*     (2006.01)
(52) U.S. Cl.
    CPC ........... *F28D 9/0093* (2013.01); *F28D 21/00* (2013.01)
(58) Field of Classification Search
    CPC ........ F28D 9/0093; F28D 21/00; F16K 11/07; F16K 3/04; G01R 31/2865; G01R 31/2893; G01R 31/2808

USPC ......................................................... 165/145
See application file for complete search history.

(56) References Cited

U.S. PATENT DOCUMENTS

| | | | |
|---|---|---|---|
| 7,197,819 B1* | 4/2007 | Rinehart | H01L 23/473 228/180.1 |
| 10,415,903 B2* | 9/2019 | Severson | F28F 1/00 |
| 11,181,576 B2* | 11/2021 | Kato | G01R 31/2891 |
| 11,224,146 B2* | 1/2022 | Langenfeld | H05K 7/20863 |
| 11,579,187 B1* | 2/2023 | Kiyokawa | G01R 31/2887 |
| 2007/0227697 A1* | 10/2007 | Takahashi | H01L 23/473 257/E23.098 |
| 2016/0036104 A1* | 2/2016 | Kenney | F28F 3/12 165/170 |
| 2016/0165752 A1* | 6/2016 | Pietrantonio | H05K 7/20927 165/121 |

(Continued)

*Primary Examiner* — Jon T. Schermerhorn, Jr.
(74) *Attorney, Agent, or Firm* — Muncy, Geissler, Olds & Lowe, P.C.

(57) ABSTRACT

A heat exchanging apparatus includes a main body and N contact blocks formed on a head end surface of the main body, where N is a natural number. The main body therein has a multi-turn flow passage, a first arc-shell flow passage and a second arc-shell flow passage. Each contact block therein has a plurality of plate-shell flow passages parallel to each other and parallel to a longitudinal direction defined by the main body. The first arc-shell flow passage and the second arc-shell flow passage respectively communicate with the multi-turn flow passage and the plurality of plate-shell flow passages. A liquid flows into the multi-turn flow passage from an inlet of the multi-turn flow passage, and flows through the first arc-shell flow passage, the plurality of plate-shell flow passages and the second arc-shell flow passage, and flows out from an outlet of the multi-turn flow passage.

10 Claims, 5 Drawing Sheets

(56) References Cited

U.S. PATENT DOCUMENTS

2019/0302178 A1   10/2019   Saito
2019/0324056 A1*  10/2019   Akers ............... G01R 31/2893

* cited by examiner

HEAT EXCHANGING APPARATUS

CROSS-REFERENCE TO RELATED APPLICATION

This application claims the priority benefits of U.S. provisional application No. 63/429,295, filed on Dec. 1, 2022 and Taiwan application serial no. 112134541, filed on Sep. 11, 2023. The entirety of each of the above-mentioned patent applications is hereby incorporated by reference herein and made a part of this specification.

BACKGROUND OF THE INVENTION

1. Field of the Invention

The invention relates to a heat exchanging apparatus, and more in particular, to a heat exchanging apparatus which provides contact surfaces to exchange heat with objects and has high heat exchange efficiency.

2. Description of the Prior Art

Heat exchanging apparatuses are used in many application fields. As used herein, "heat exchanging apparatus" means an apparatus that provides contact surfaces to exchange heat with objects.

There are also many application fields for the heat exchanging apparatus that provides contact surfaces to exchange heat with objects, such as the test field of electronic devices and semiconductor devices. The contact surfaces of the heat exchanging apparatus urge against the devices under test, and a high or low temperature liquid flows into and out of the interior of the heat exchanging apparatus to exchange heat with the devices under test. Thereby, the devices under test can be tested at high or low temperature.

Regarding a prior art of the heat exchanging apparatus, referring to U.S. patent publication no. 20190302178. Also referring to FIG. 1, FIG. 1 is a cross-sectional view of the heat exchanging apparatus 1 disclosed in U.S. patent publication no. 20190302178.

As shown in FIG. 1, the heat exchanging apparatus 1, disclosed in U.S. patent publication no. 20190302178, includes a thermal block 10. The thermal block 10 is formed of a metal material having excellent thermal conductivity.

A flow passage 100 for liquid flow is formed inside the thermal block 10. An inlet 1002 and an outlet 1004 of the flow passage 100 are formed on the rear end surface 102 of the thermal block 10 and are connected to a temperature adjusting apparatus (not illustrated in the drawings). The thermal block 10 defines a longitudinal direction L1, as shown in FIG. 1. In the flow passage 100, near the front end surface 104 of the thermal block 10, there are formed a plurality of plate-shell flow passages 106 parallel to each other and parallel to the longitudinal direction L1. The structures between adjacent plate-shell flow passages 106 are similar to heat-dissipating fins 108. The flow passage 100 communicates with the plurality of plate-shell flow passages 106. The front end surface 104 serves as the contact surface to exchange heat with the urged device under test.

The heat exchanging apparatus 1 shown in FIG. 1 also includes a first heat transfer sheet 12 and a second heat transfer 14. The first heat transfer sheet 12 overlaps a front end surface 104 of the thermal block 10. The second heat transfer sheet 14 overlaps the front end surface 104 of the thermal block 10 through the first heat transfer sheet 12. The problems and drawbacks of the construction of the thermal block 10 itself will be described in detail below, without further description of the first heat transfer sheet 12 and the second heat transfer sheet 14.

The flow passage 100 has an inflow direction d1 at a contact portion with the plurality of plate-shell flow passages 106. However, the inflow direction d1 is perpendicular to the longitudinal direction L1. This makes it difficult for new liquid to flow into the flow path 100 to replace the liquid flowing into the plurality of plate-shell flow passages 106, and even causes the liquid in the plurality of plate-shell flow passages 106 to stagnate and not flow. This naturally reduces the heat exchange efficiency of the heat exchanging apparatus 1.

Furthermore, the newly flowing liquid into the flow passage 100 does not flow into the plurality of plate-shell flow passages 106 at the same time, but rather flows sequentially into plurality of parallelly arranged plate-shell flow passages 106. This naturally results in the plate-shell passages 106 being less effective at utilizing the heat exchange of the liquid the closer they are to the outlet 1004 of the flow passage 100.

In addition, the heat exchange apparatus 1 disclosed in U.S. Patent publication No. 20190302178 is apparently made by conventional machining technology, so that the thermal block 10 thereof can only be made of a metal material having excellent thermal conductivity, and cannot be made of other materials having higher thermal conductivity such as a ceramic material.

SUMMARY OF THE INVENTION

Accordingly, one scope of the invention is to provide a heat exchanging apparatus which provides contact surfaces to exchange heat with objects and has high heat exchange efficiency.

A heat exchanging apparatus according to a preferred embodiment of the invention includes a main body and N contact blocks, where N is a natural number. The main body has a head end surface and a tail end surface, and defines a longitudinal direction. The main body therein has a multi-turn flow passage, a first arc-shell flow passage and a second arc-shell flow passage. An inlet and an outlet of the multi-turn flow passage are exposed on the main body.

The N contact blocks are formed on the head end surface of the main body. Each contact block has a respective contact surface. Each contact block therein has a plurality of plate-shell flow passages parallel to each other and parallel to the longitudinal direction. The first arc-shell flow passage respectively communicates with the multi-turn flow passage and the plurality of plate-shell flow passages of each contact block. The second arc-shell flow passage respectively communicates with the multi-turn flow passage and the plurality of plate-shell flow passages of each contact block. A liquid flows into the multi-turn flow passage from the inlet, flows through the first arc-shell flow passage, the plurality of plate-shell flow passages and the second arc-shell flow passage, and flows out from the outlet. When the liquid flows through the plurality of plate-shell flow passages, the liquid exchanges heat with the N contact blocks.

In one embodiment, the first arc-shell flow passage has an inflow direction. A first angle between the inflow direction and the longitudinal direction is less than 90 degrees.

In one embodiment, the second arc-shell flow passage has an outflow direction. A second angle between the outflow direction and the longitudinal direction is greater than 90 degrees.

In one embodiment, the first arc-shell flow passage has a first mesh contour.

In one embodiment, the second arc-shell flow passage has a second mesh contour.

In one embodiment, the first arc-shell flow passage communicates with a first side of a respective lower port of each of the plate-shell flow passages.

In one embodiment, the second arc-shell flow passage communicates with a second side of the respective lower port of each of the plate-shell flow passages.

In one embodiment, the main body also has a side surface adjacent to the tail end surface. The inlet and the outlet of the multi-turn flow passage are exposed on the side surface of the main body.

In one embodiment, the N contact blocks protrude upward from the head end surface of the main body.

In one embodiment, the main body and the N contact blocks can be made of a metal material or a ceramic material.

Different from the prior art, the heat exchanging apparatus according to the invention has high heat exchange efficiency by allowing the liquid in the plurality of plate-shell flow passages, which is mainly in heat exchange with the contact surfaces, to flow rapidly.

The advantage and spirit of the invention may be understood by the following recitations together with the appended drawings.

BRIEF DESCRIPTION OF THE APPENDED DRAWINGS

DETAILED DESCRIPTION OF THE INVENTION

Some preferred embodiments and practical applications of this present invention would be explained in the following paragraph, describing the characteristics, spirit, and advantages of the invention.

Figure 1:
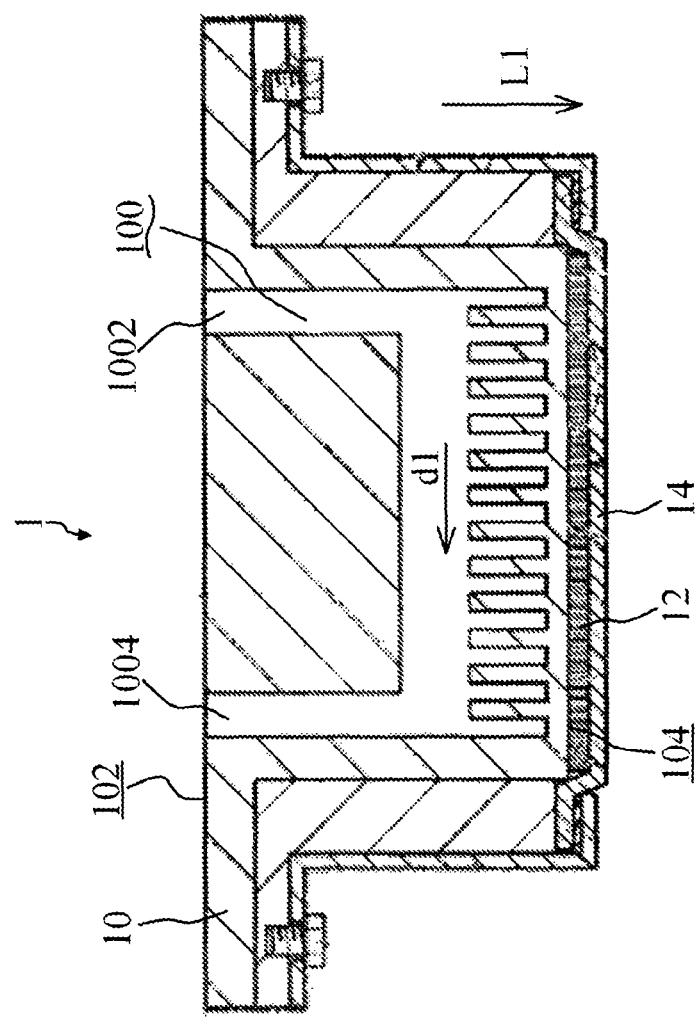
FIG. 1 is a perspective view of a heat exchanging apparatus of the prior art.
Figure 2:
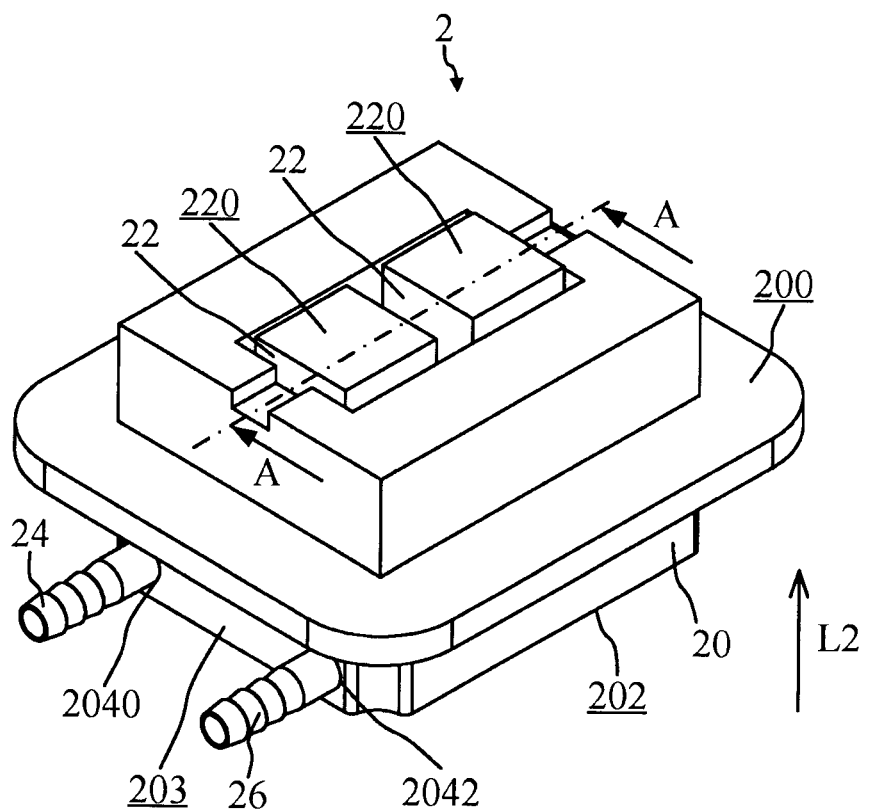
FIG. 2 is a perspective view of a heat exchanging apparatus according to the preferred embodiment of the invention.
Figure 3:
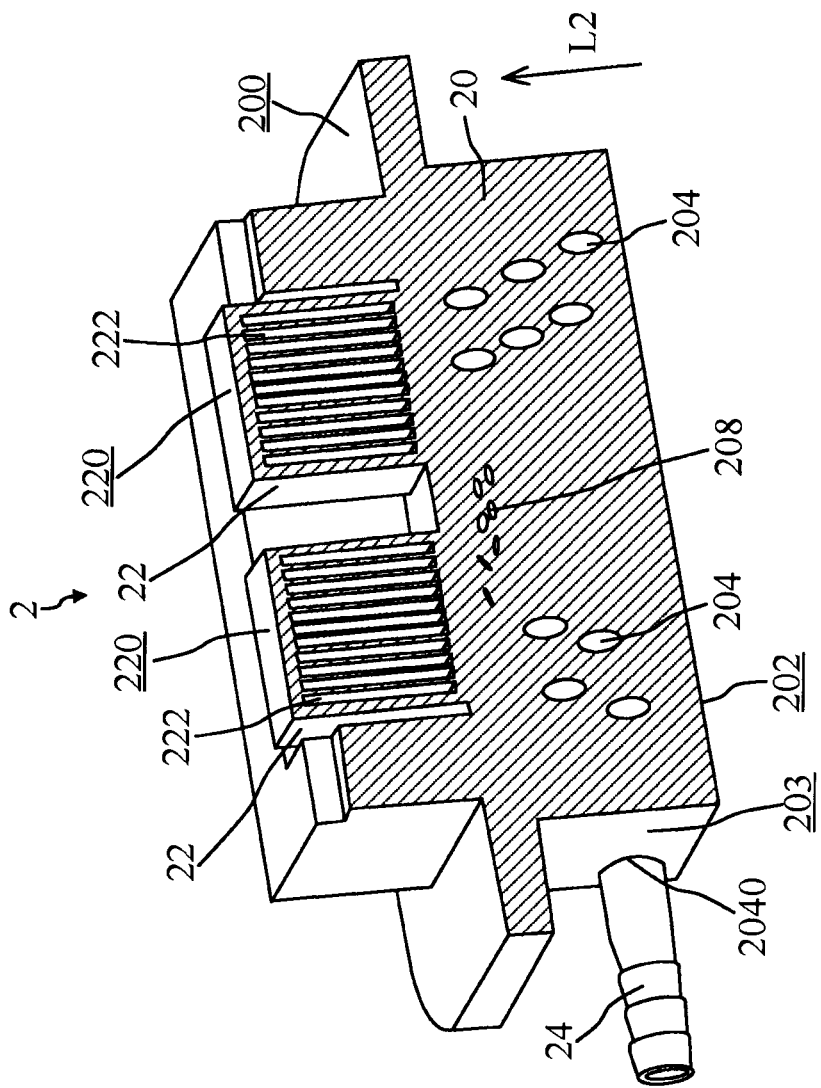
FIG. 3 is a cross-sectional view taken along line A-A of the heat exchanging apparatus shown in FIG. 2.
Figure 4:
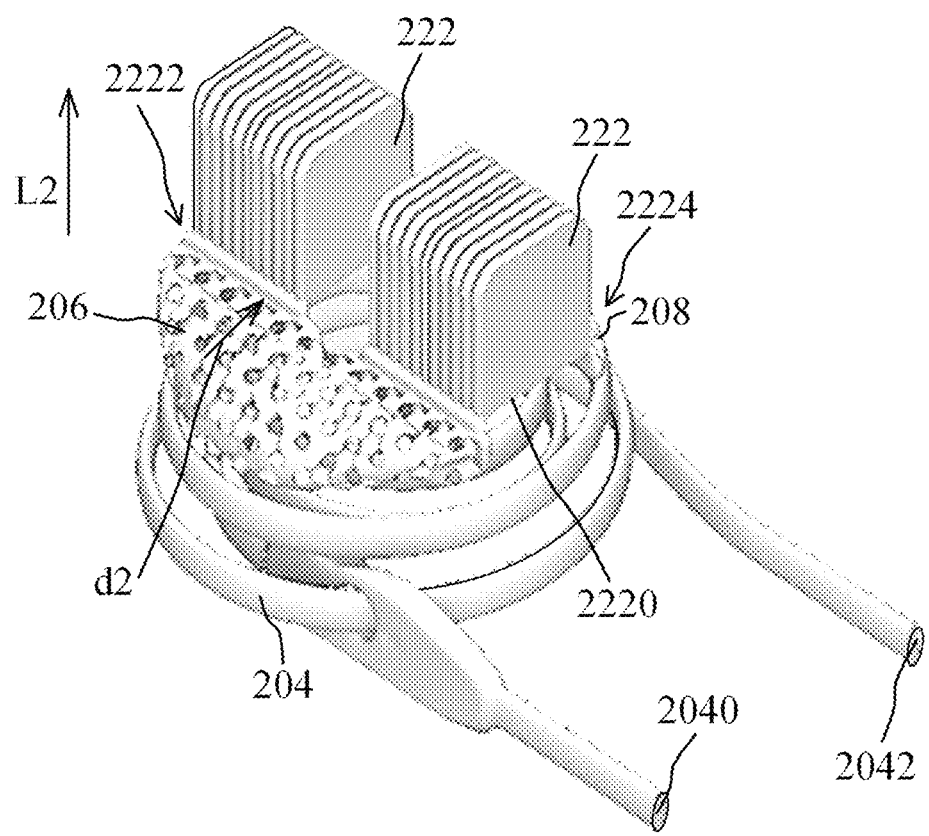
FIG. 4 is a schematic diagram of the internal flow passage of the heat exchanging apparatus according to the preferred embodiment of the invention.
Figure 5:
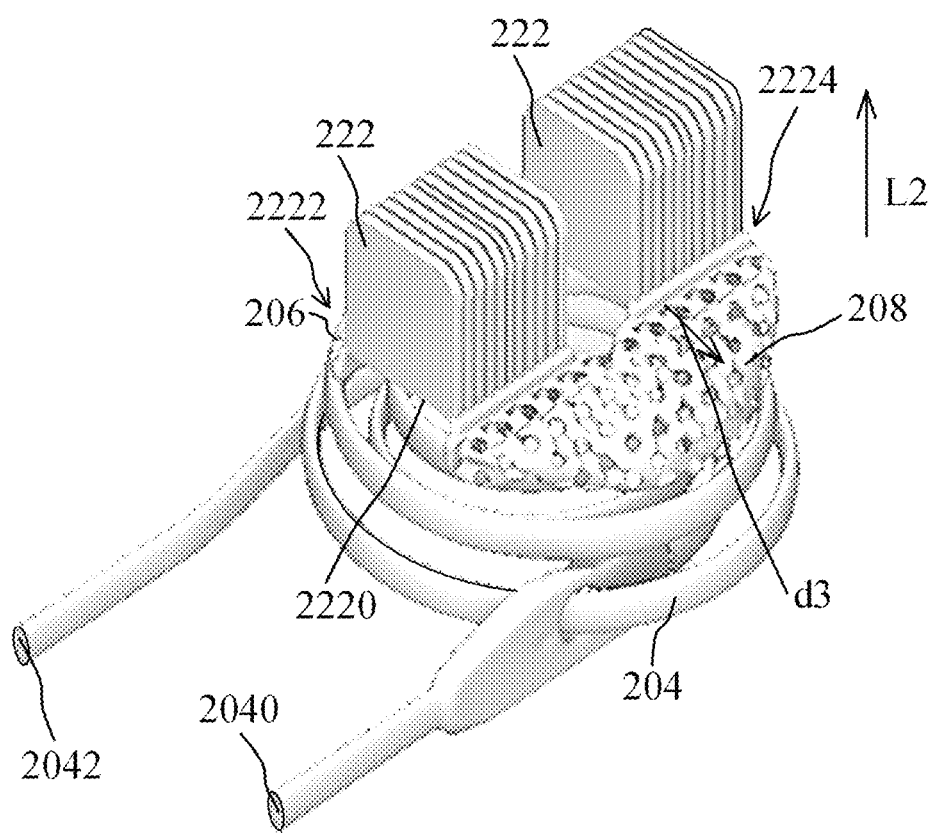
FIG. 5 is another schematic diagram of the internal flow passage of the heat exchanging apparatus according to the preferred embodiment of the invention.

Referring to FIG. 2, FIG. 3, FIG. 4 and FIG. 5, those drawings schematically show a heat exchanging apparatus 2 according to the preferred embodiment of the invention. FIG. 2 schematically shows the heat exchanging apparatus 2 according to the preferred embodiment of the invention with a perspective view. FIG. 3 is a cross-sectional view taken along line A-A of the heat exchanging apparatus 2 shown in FIG. 2. FIG. 4 is a schematic diagram of the internal flow passage of the heat exchanging apparatus according to the preferred embodiment of the invention. FIG. 5 is another schematic diagram of the internal flow passage of the heat exchanging apparatus according to the preferred embodiment of the invention. It is preliminarily stated that the flow passages shown in FIG. 4 and FIG. 5 are illustrated as solid lines for clarity of depiction, but are not physical structures.

As shown in FIG. 2, FIG. 3, FIG. 4 and FIG. 5, the heat exchanging apparatus 2 according to the preferred embodiment of the invention includes a main body 20 and N contact blocks 22, where N is a natural number. In FIG. 2, two contact blocks 22 are illustrated as representative.

As shown in FIG. 2 and FIG. 3, the main body 20 has a head end surface 200 and a tail end surface 202. The main body 20 defines a longitudinal direction L2. As shown in FIG. 4 and FIG. 5, the main body 20 therein has a multi-turn flow passage 204, a first arc-shell flow passage 206 and a second arc-shell flow passage 208. An inlet 2040 and an outlet 2042 of the multi-turn flow passage 204 are exposed on the main body 20. In one embodiment, the main body 20 also has a side surface 203 adjacent to the tail end surface 202. The inlet 2040 and the outlet 2042 of the multi-turn flow passage 204 are exposed on the side surface 203 of the main body 20, as shown in FIG. 2 and FIG. 3. In practical application, the trailing end surface 202 of the main body 20 can be operatively coupled to a power system (e.g., a mechanical power system) to bear an applied external force.

As shown in FIG. 2, an inlet tube 24 is connected to the inlet 2040 of the multi-turn flow passage 204, and an outlet tube 26 is connected to the outlet 2042 of the multi-turn flow passage 204. The inlet tube 24 and the outlet tube 26 are connected to a temperature adjusting apparatus (not illustrated in the drawings).

As shown in FIG. 2 and FIG. 3, the N contact blocks 22 are formed on the head end surface 200 of the main body 20. Each contact block 22 has a respective contact surface 220. The objects to exchange heat with the heat exchanging apparatus 2 according to the preferred embodiment of the invention can be urged against the contact surfaces 220 of the N contact blocks 22.

In one embodiment, as shown in FIG. 2 and FIG. 3, the N contact blocks 22 protrude upward from the head end surface 200 of the main body 20.

Each contact block 22 therein has a plurality of plate-shell flow passages 222 parallel to each other and parallel to the longitudinal direction L2. The first arc-shell flow passage 206 respectively communicates with the multi-turn flow passage 204 and the plurality of plate-shell flow passages 222 of each contact block 22. The second arc-shell flow passage 208 respectively communicates with the multi-turn flow passage 204 and the plurality of plate-shell flow passages 222 of each contact block 22.

A liquid flows into the multi-turn flow passage 204 from the inlet 2040, flows through the first arc-shell flow passage 206, the plurality of plate-shell flow passages 222 and the second arc-shell flow passage 208, and flows out from the outlet 2042. When the liquid flows through the plurality of plate-shell flow passages 222, the liquid exchanges heat with the N contact blocks 22.

It is emphasized herein that, different from the prior art, after the liquid flows into the heat exchanging apparatus 2 according to the invention, the liquid flows into the plurality of plate-shell flow passages 222 at the same time, which does not lead to the problem of non-uniform heat exchange in the heat exchanging apparatus 1 of the prior art.

In one embodiment, as shown in FIG. 4, the first arc-shell flow passage 206 has an inflow direction d2. A first angle between the inflow direction d2 and the longitudinal direction L2 is less than 90 degrees. It is emphasized herein that different from the prior art, the inflow direction d2 of the first arc-shell flow passage 206 is not perpendicular to the longitudinal direction L2. Thereby, the liquid in the first arc-shell flow passage 206 flows easily into the plurality of plate-shell passages 222, which enhances the heat exchange efficiency of the heat exchanging apparatus 2 according to the preferred embodiment of the invention.

In one embodiment, as shown in FIG. 5, the second arc-shell flow passage 208 has an outflow direction d3. A second angle between the outflow direction and the longitudinal direction L2 is greater than 90 degrees. It is emphasized herein that different from the prior art, the outflow direction d3 of the second arc-shell flow passage 208 is not perpendicular to the longitudinal direction L2. Thereby, the liquid in the plurality of plate-shell passages 222 flows easily into the second arc-shell flow passage 206, which enhances the heat exchange efficiency of the heat exchanging apparatus 2 according to the preferred embodiment of the invention.

In one embodiment, as shown in FIG. 4, the first arc-shell flow passage 206 has a first mesh contour. The mesh portion of the first arc-shell flow passage 206 with the first mesh contour is actually filled with the material used to manufacture the main body 20, and thereby, this structure can further enhance the heat exchange efficiency of the heat exchanging apparatus 2 according to the invention.

In one embodiment, the second arc-shell flow passage 208 has a second mesh contour. The mesh portion of the second arc-shell flow passage 208 with the second contour is actually filled with the material used to manufacture the main body 20, and thereby, this structure can further enhance the heat exchange efficiency of the heat exchanging apparatus 2 according to the invention In one embodiment, the first arc-shell flow passage 206 communicates with a first side 2222 of a respective lower port 2220 of each of the plate-shell flow passages 222.

In one embodiment, the second arc-shell flow passage 208 communicates with a second side 2224 of the respective lower port 2220 of each of the plate-shell flow passages 222.

In one embodiment, the main body 20 and the N contact blocks 22 can be made of a metal material or a ceramic material.

The main body 20 and the N contact blocks 22 can be made by an additive manufacturing process. The main body 20 and the N contact blocks 22 can be divided into blocks that can be cast in advance, and then bonded together after being cast.

With the detailed description of the above preferred embodiments of the invention, it is clear to understand that the heat exchanging apparatus according to the invention has high heat exchange efficiency by allowing the liquid in the plurality of plate-shell flow passages, which is mainly in heat exchange with the contact surfaces, to flow rapidly.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A heat exchanging apparatus, comprising:
   a main body, having a head end surface and a tail end surface and defining a longitudinal direction, wherein the main body therein has a multi-turn flow passage, a first arc-shell flow passage and a second arc-shell flow passage, an inlet and an outlet of the multi-turn flow passage are exposed on the main body; and
   N contact blocks, formed on the head end surface of the main body, each contact block having a respective contact surface, wherein N is a natural number, each contact block therein has a plurality of plate-shell flow passages parallel to each other and parallel to the longitudinal direction, the first arc-shell flow passage respectively communicates with the multi-turn flow passage and the plurality of plate-shell flow passages of each contact block, the second arc-shell flow passage respectively communicates with the multi-turn flow passage and the plurality of plate-shell flow passages of each contact block,
   wherein a liquid flows into the multi-turn flow passage from the inlet, flows through the first arc-shell flow passage, the plurality of plate-shell flow passages and the second arc-shell flow passage, and flows out from the outlet, when the liquid flows through the plurality of plate-shell flow passages, the liquid exchanges heat with the N contact blocks.

2. The heat exchanging apparatus of claim 1, wherein the first arc-shell flow passage has an inflow direction, a first angle between the inflow direction and the longitudinal direction is less than 90 degrees.

3. The heat exchanging apparatus of claim 2, wherein the second arc-shell flow passage has an outflow direction, a second angle between the outflow direction and the longitudinal direction is greater than 90 degrees.

4. The heat exchanging apparatus of claim 3, wherein the first arc-shell flow passage has a first mesh contour.

5. The heat exchanging apparatus of claim 4, wherein the second arc-shell flow passage has a second mesh contour.

6. The heat exchanging apparatus of claim 3, wherein the first arc-shell flow passage communicates with a first side of a respective lower port of each of the plate-shell flow passages.

7. The heat exchanging apparatus of claim 6, wherein the second arc-shell flow passage communicates with a second side of the respective lower port of each of the plate-shell flow passages.

8. The heat exchanging apparatus of claim 3, wherein the main body also has a side surface adjacent to the tail end surface, the inlet and the outlet of the multi-turn flow passage are exposed on the side surface of the main body.

9. The heat exchanging apparatus of claim 3, wherein the N contact blocks protrude upward from the head end surface of the main body.

10. The heat exchanging apparatus of claim 3, wherein the main body and the N contact blocks are made of a metal material or a ceramic material.

* * * * *